(12) United States Patent
Krishnamourthy et al.

(10) Patent No.: US 11,177,650 B2
(45) Date of Patent: Nov. 16, 2021

(54) OVERVOLTAGE PROTECTION CIRCUIT

(71) Applicant: TEXAS INSTRUMENTS INCORPORATED, Dallas, TX (US)

(72) Inventors: Karthikeyan Krishnamourthy, Moosburg an der Isar (DE); Viola Schaffer, Freising (DE); Karim Thomas Taghizadeh Kaschani, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 145 days.

(21) Appl. No.: 16/536,825

(22) Filed: Aug. 9, 2019

(65) Prior Publication Data
US 2021/0044105 A1    Feb. 11, 2021

(51) Int. Cl.
| | |
|---|---|
| H02H 9/04 | (2006.01) |
| H03F 1/52 | (2006.01) |
| H02H 9/00 | (2006.01) |
| H02H 3/14 | (2006.01) |
| H03F 3/16 | (2006.01) |
| H02H 3/22 | (2006.01) |
| H02H 3/20 | (2006.01) |

(52) U.S. Cl.
CPC ............. *H02H 9/04* (2013.01); *H02H 3/14* (2013.01); *H02H 9/00* (2013.01); *H03F 1/52* (2013.01); *H02H 3/20* (2013.01); *H02H 3/22* (2013.01); *H03F 1/523* (2013.01); *H03F 3/16* (2013.01)

(58) Field of Classification Search
CPC .. H02H 9/04; H02H 9/00; H02H 3/22; H02H 3/14; H02H 3/20; H03F 1/52; H03F 3/16; H03F 1/523; H03K 5/24

USPC .......................................... 361/56, 91.1, 111
See application file for complete search history.

(56) References Cited

U.S. PATENT DOCUMENTS

| | | | | |
|---|---|---|---|---|
| 3,708,694 A | * | 1/1973 | Evans | H03G 11/00 327/319 |
| 5,742,463 A | * | 4/1998 | Harris | H02H 9/025 361/111 |
| 6,970,337 B2 | * | 11/2005 | Strahm | H02H 9/025 361/58 |

(Continued)

OTHER PUBLICATIONS

Analog Devises. "OVP and EMI Protected, Precision, Low Noise and Bias Current Op Amps." Data Sheet ADA4177-1/ADA4177-2/ADA4177-4. 2014-2018, pp. 1-33.

(Continued)

*Primary Examiner* — Danny Nguyen
(74) *Attorney, Agent, or Firm* — John R. Pessetto; Charles A. Brill; Frank D. Cimino (57) ABSTRACT

An overvoltage protection circuit includes an input terminal, an output terminal, a clamp transistor, and a selector circuit. The clamp transistor is configured to control current flow between the input terminal and the output terminal. The clamp transistor includes a first terminal coupled to the input terminal, a second terminal coupled to the output terminal. The selector circuit is configured to control a resistance of the clamp transistor based on a voltage at the input terminal. The selector circuit includes a first terminal coupled to the first terminal of the clamp transistor, a second terminal coupled to the second terminal of the clamp transistor, and a third terminal coupled to a third terminal of the clamp transistor.

9 Claims, 4 Drawing Sheets

(56) References Cited

U.S. PATENT DOCUMENTS

| | | | |
|---|---|---|---|
| 8,519,771 B1* | 8/2013 | Cical | H03K 19/00315 |
| | | | 327/427 |
| 2015/0311872 A1* | 10/2015 | Gerstenhaber | H03F 3/45475 |
| | | | 330/298 |

OTHER PUBLICATIONS

Texas Instruments. "INA118 Precision, Low-Power Instrumentation Amplifier." INA118, SBOS027B-September—Revised Apr. 2019, pp. 1-31.

Texas Instruments. "INA828 50-μV Offset, 7-nV/√Hz Noise, Low-Power, Precision Instrumentation Amplifier." INA828, SBOS792A-Aug. 2017—Revised Jan. 2018, pp. 1-39.

* cited by examiner

OVERVOLTAGE PROTECTION CIRCUIT

BACKGROUND

Overvoltage protection circuits are often included in electronic devices to protect the internal components of the devices from over-voltage conditions at the device inputs. For example, an over-voltage condition can occur when an external accessory or component is connected to or disconnected from an input of a device while the external accessory or component is active. Such an over-voltage condition may be characterized by a large positive or negative voltage transient that may damage the internal components or circuitry of the device in the absence of an appropriately implemented overvoltage protection circuit.

SUMMARY

An overvoltage protection circuit for protecting an input of electronic circuit, such as an amplifier, is disclosed herein. In one example, an amplifier circuit includes a signal input terminal, an operational amplifier, and an overvoltage protection circuit. The overvoltage protection circuit is coupled to the signal input terminal and an input of the amplifier. The overvoltage protection circuit includes a first transistor, a second transistor, and a third transistor. The first transistor includes a first terminal coupled to the signal input terminal, and a second terminal coupled to the input of the amplifier. The second transistor includes a first terminal coupled to the signal input terminal, a second terminal coupled to a third terminal of the first transistor, and a third terminal coupled to the third terminal of the first transistor. The third transistor includes a first terminal coupled to the third terminal of the first transistor, a second terminal coupled to the input of the amplifier, and a third terminal coupled to the third terminal of the first transistor.

In another example, an overvoltage protection circuit includes an input terminal, an output terminal, a first transistor, a second transistor, and third transistor. The first transistor includes a first terminal coupled to the input terminal, and a second terminal coupled to the output terminal. The second transistor includes a first terminal coupled to the input terminal, a second terminal coupled to a third terminal of the first transistor, and a third terminal coupled to the third terminal of the first transistor. The third transistor includes a first terminal coupled to the third terminal of the first transistor, a second terminal coupled to the output terminal, and a third terminal coupled to the third terminal of the first transistor.

In a further example, an overvoltage protection circuit includes an input terminal, an output terminal, a clamp transistor, and a selector circuit. The clamp transistor is configured to control current flow between the input terminal and the output terminal. The clamp transistor includes a first terminal coupled to the input terminal, and a second terminal coupled to the output terminal. The selector circuit is configured to control a resistance of the clamp transistor based on a voltage at the input terminal. The selector circuit includes a first terminal coupled to the first terminal of the clamp transistor, a second terminal coupled to the second terminal of the clamp transistor, and a third terminal coupled to a third terminal of the clamp transistor.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Some electronic circuits protect input circuitry by including overvoltage protection that limits current flow between the input circuitry and input terminals of the electronic circuit. The overvoltage protection is implemented using a limiting resistor in series with the input circuitry in some electronic circuits. However, a series limiting resistor introduces errors (e.g., noise) that are not acceptable in some applications, such as precision amplifiers.

Some circuits use junction field effect transistors (JFETs) to limit current as an alternative to resistors. Some JFET-based overvoltage protection circuits use multiple JFETs in series to limit current to a safe value, but such implementations require large JFETs that consume substantial die area. Other JFET-based overvoltage protection circuits employ a single JFET in series with the input circuitry. However, the protection provided by some such circuits is asymmetrical. That is, input current limits differ for positive and negative input voltages.

The overvoltage protection circuits disclosed herein are area efficient and provide symmetrical protection. For example, an overvoltage protection circuit of the present disclosure may be one-third the size of an overvoltage protection circuit employing two JFETs in series, while also providing symmetrical protection. Some implementations employ a single clamp transistor in series with input circuitry. The resistance of the clamp transistor is controlled by a maximum or minimum selector circuit.

Figure 1:
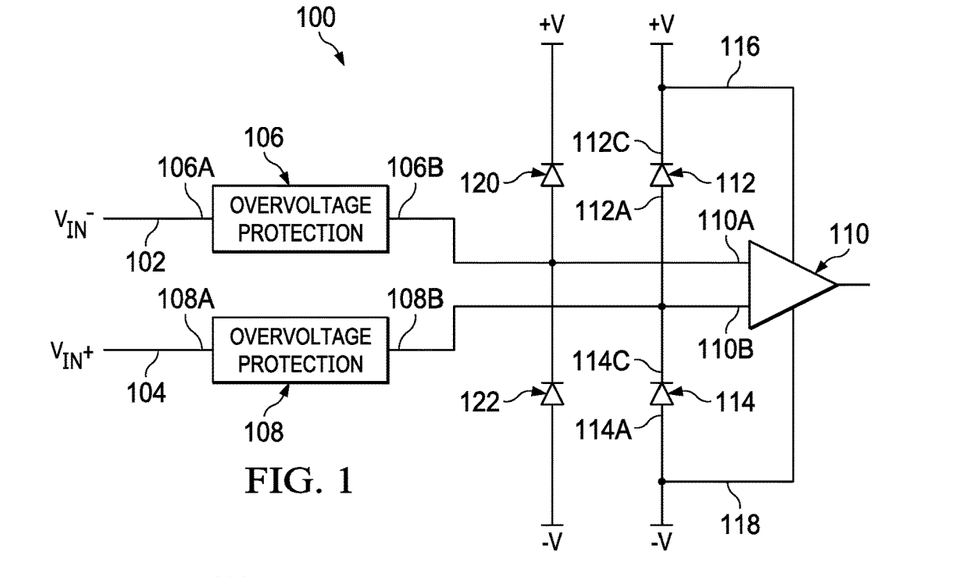
FIG. 1 shows a block diagram for an amplifier circuit that includes overvoltage protection in accordance with this description.

FIG. 1 shows a block diagram for an amplifier circuit 100 that includes overvoltage protection in accordance with this description. The amplifier circuit 100 includes an input terminal 102, an input terminal 104, an overvoltage protection circuit 106, an overvoltage protection circuit 108, an amplifier 110, a diode 112, and a diode 114. The amplifier 110 may include one more than one operational amplifier in some implementations. For example, the amplifier 110 is an instrumentation amplifier than that includes two input buffer amplifiers and a third operational amplifier that receives output of the buffer amplifiers in some implementations.

The overvoltage protection circuit 106 is coupled to the input terminal 102 and the amplifier 110, and limits current flow between the input terminal 102 and the amplifier 110. The overvoltage protection circuit 106 includes an input terminal 106A coupled to the input terminal 102, and an output terminal 106B coupled to the input 110A of the amplifier 110.

The overvoltage protection circuit 108 is coupled to the input terminal 104 and the amplifier 110, and limits current flow between the input terminal 104 and the amplifier 110. The overvoltage protection circuit 108 includes an input terminal 108A coupled to the input terminal 104, and an output terminal 108B coupled to the input 1106 of the amplifier 110. The overvoltage protection circuit 106 and the overvoltage protection circuit 108 are JFET-based circuits as described herein.

The diode 112 and the diode 114 couple the input 110B to the power rails 116 and 118. The cathode terminal 112C of the diode 112 is coupled to the power rail 116, and the anode terminal 112A of the diode 112 is coupled to the input 110B of the amplifier 110. The anode terminal 114A of the diode 114 is coupled to the power rail 118, and the cathode terminal 114C of the diode 114 is coupled to the input 110B of the amplifier 110. Similarly, the diode 120 couples the input 110A to the power rail 116, and the diode 122 couples the input 110A to the power rail 118.

Figure 2:
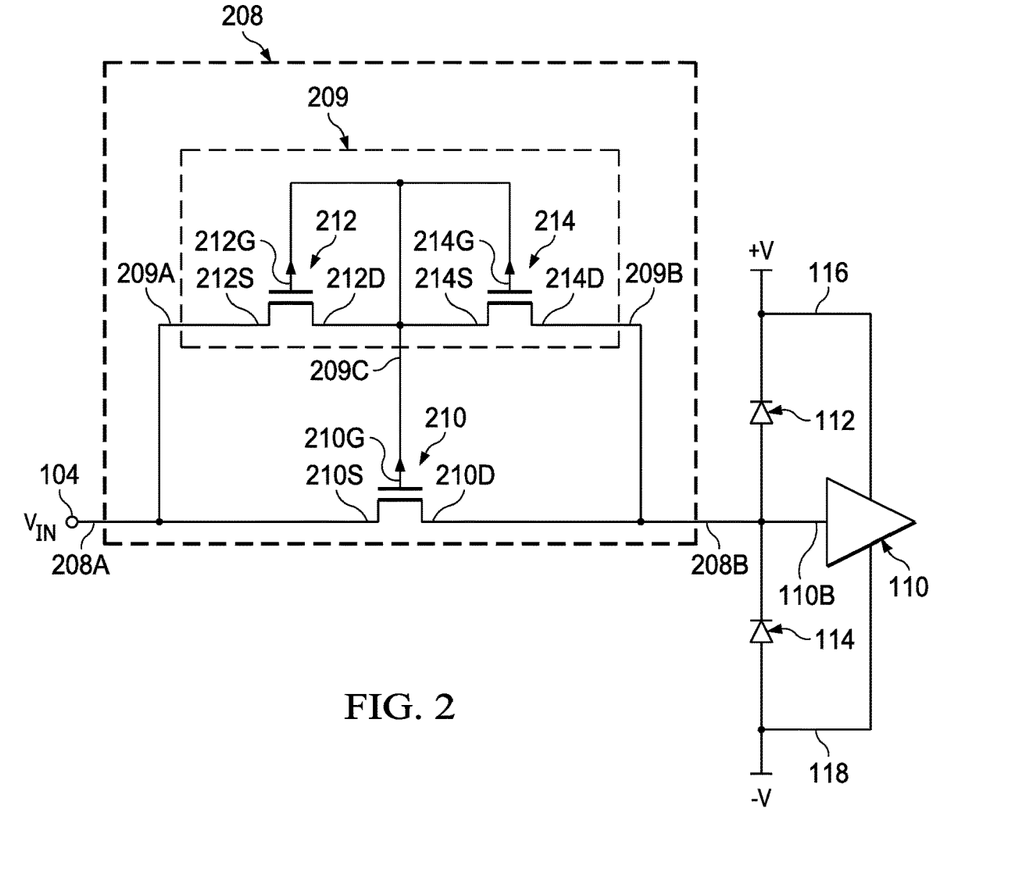
FIGS. 2-5 show schematic diagrams for overvoltage protection circuits in accordance with this description.

FIG. 2 shows a schematic diagram for an overvoltage protection circuit 208 in accordance with this description. The overvoltage protection circuit 208 is an implementation of the overvoltage protection circuit 106 or the overvoltage protection circuit 108. The amplifier 110, the diode 112, and the diode 114 are shown in FIG. 2 for context. The overvoltage protection circuit 208 includes an input terminal 208A, an output terminal 208B, a maximum selector circuit 209 and a clamp transistor 210. The clamp transistor 210 is a p-channel depletion mode JFET in some implementations of the 208. The resistance of the clamp transistor 210 varies based on the voltage at the input terminal 208A to control the current flow between the input terminal 208A and the output terminal 208B. The clamp transistor 210 includes a source terminal 210S coupled to the input terminal 208A (and the input terminal 104 or the input terminal 102) and a drain terminal 210D coupled to the output terminal 208B (and the input 110B or the input 110A of the amplifier 110).

The maximum selector circuit 209 is coupled to the clamp transistor 210, and controls the resistance of the clamp transistor 210 based on the voltage at the input terminal 208A. The maximum selector circuit 209 includes a terminal 209A, a terminal 209B, and a terminal 209C. The terminal 209A is coupled to the source terminal 210S of the clamp transistor 210. The terminal 209B is coupled to the drain terminal 210D of the clamp transistor 210. The terminal 209C is coupled to the gate terminal 210G of the clamp transistor 210.

The maximum selector circuit 209 includes a transistor 212 and a transistor 214. The transistor 212 and the transistor 214 are p-channel depletion mode JFETs in some implementations of the 209. The transistor 212 controls the clamp transistor 210 when the voltage at the input terminal 104 is greater than +V, and the transistor 214 controls the clamp transistor 210 when the voltage at the input terminal 104 is less than −V. The source terminal 212S of the transistor 212 is coupled to the source terminal 210S of the clamp transistor 210. The drain terminal 212D of the transistor 212 is coupled to the gate terminal 212G of the transistor 212 and the gate terminal 210G of the clamp transistor 210. The source terminal 214S of the transistor 214 is coupled to the drain terminal 212D of the transistor 212 and the gate terminal 214G of the transistor 214. The drain terminal 214D of the transistor 214 is coupled to the drain terminal 210D of the clamp transistor 210.

Figure 3:
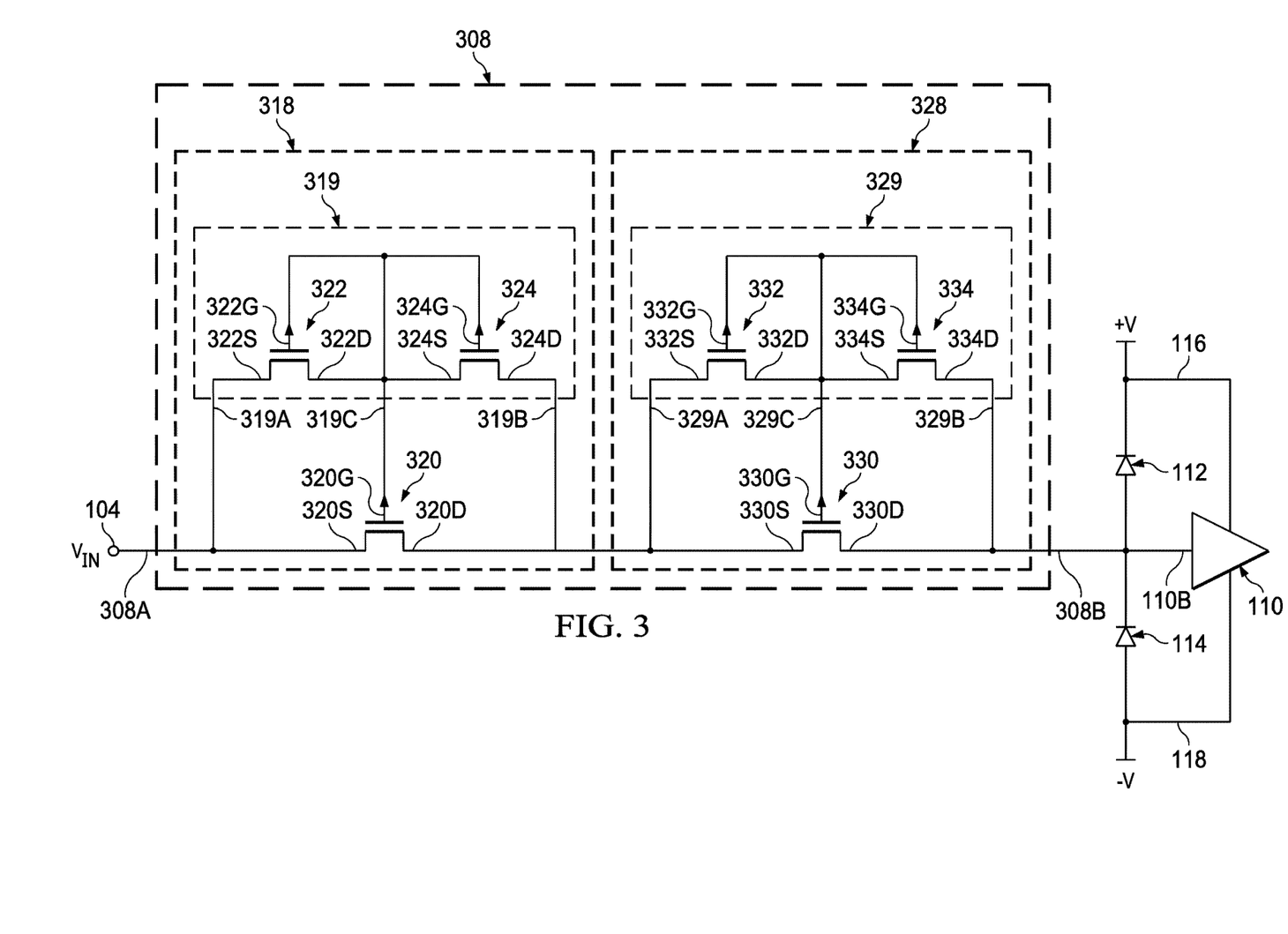

FIG. 3 shows a schematic diagram for an overvoltage protection circuit 308 in accordance with this description. The overvoltage protection circuit 308 is an implementation of the overvoltage protection circuit 106 or the overvoltage protection circuit 108. The amplifier 110, the diode 112, and the diode 114 are shown in FIG. 3 for context. The overvoltage protection circuit 308 includes an input terminal 308A, an output terminal 308B, an overvoltage protection circuit 318 and an overvoltage protection circuit 328. The overvoltage protection circuit 318 and the overvoltage protection circuit 328 are coupled in series. The overvoltage protection circuit 318 and the overvoltage protection circuit 328 are implementations of the overvoltage protection circuit 208. Some implementations of the overvoltage protection circuit 308 provide twice the overvoltage protection as provided by implementations of the overvoltage protection circuit 208, while requiring less circuit area (e.g., about 45% less circuit area) than some series JFET-based overvoltage protection circuits. For example, an implementation of the overvoltage protection circuit 308 provides protection from overvoltage as high as 80 volts, while the overvoltage protection circuit 208 provides protection from overvoltage as high as 40 volts.

The overvoltage protection circuit 318 includes a maximum selector circuit 319 and a clamp transistor 320. The clamp transistor 320 is a p-channel depletion mode JFET in some implementations of the 308. The resistance of the clamp transistor 320 varies based on the voltage at the input terminal 308A to control the current flow between the input terminal 308A and the output terminal 308B. The clamp transistor 320 includes a source terminal 320S coupled to the input terminal 308A and a drain terminal 320D coupled to the output terminal 308B via the overvoltage protection circuit 328.

The maximum selector circuit 319 is coupled to the clamp transistor 320, and controls the resistance of the clamp transistor 320 based on the voltage at the input terminal 308A. The maximum selector circuit 319 includes a terminal 319A, a terminal 319B, and a terminal 319C. The terminal 319A is coupled to the source terminal 320S of the clamp transistor 320. The terminal 319B is coupled to the drain terminal 320D of the clamp transistor 320. The terminal 319C is coupled to the gate terminal 320G of the clamp transistor 320.

The maximum selector circuit 319 includes a transistor 322 and a transistor 324. The transistor 322 and the transistor 324 are p-channel depletion mode JFETs in some implementations of the 319. The transistor 322 controls the clamp transistor 320 when the voltage at the input terminal 104 is greater than +V, and the transistor 324 controls the clamp transistor 320 when the voltage at the input terminal 104 is less than −V. The source terminal 322S of the transistor 322 is coupled to the source terminal 320S of the clamp transistor 320. The drain terminal 322D of the transistor 322 is coupled to the gate terminal 322G of the transistor 322 and the gate terminal 320G of the clamp transistor 320. The source terminal 324S of the transistor 324 is coupled to the drain terminal 322D of the transistor 322 and the gate terminal 324G of the transistor 324. The drain terminal 324D of the transistor 324 is coupled to the drain terminal 320D of the clamp transistor 320.

The overvoltage protection circuit 328 includes a maximum selector circuit 329 and a clamp transistor 330. The clamp transistor 330 is a p-channel depletion mode JFET in some implementations of the 328. The resistance of the clamp transistor 330 varies based on the voltage at the drain terminal 320D of the clamp transistor 320 to control the current flow between the input terminal 308A and the output terminal 308B. The clamp transistor 330 includes a source terminal 330S coupled to the drain terminal 320D of the clamp transistor 320 and a drain terminal 330D coupled to the output terminal 308B (and the input terminal 110B of the amplifier 110).

The maximum selector circuit 329 is coupled to the clamp transistor 330, and controls the resistance of the clamp transistor 330 based on the voltage at the drain terminal 320D of the clamp transistor 320. The maximum selector circuit 329 includes a terminal 329A, a terminal 329B, and a terminal 329C. The terminal 329A is coupled to the source terminal 330S of the clamp transistor 330. The terminal 329B is coupled to the drain terminal 330D of the clamp transistor 330. The terminal 329C is coupled to the gate terminal 330G of the clamp transistor 330.

The maximum selector circuit 329 includes a transistor 332 and a transistor 334. The transistor 332 and the transistor 334 are p-channel depletion mode JFETs in some implementations of the 329. The transistor 332 controls the clamp transistor 330 when the voltage at the input terminal 104 is greater than +V, and the transistor 334 controls the clamp transistor 330 when the voltage at the input terminal 104 is less than −V. The source terminal 332S of the transistor 332 is coupled to the source terminal 330S of the clamp transistor 330. The drain terminal 332D of the transistor 332 is coupled to the gate terminal 332G of the transistor 332 and the gate terminal 330G of the clamp transistor 330. The source terminal 334S of the transistor 334 is coupled to the drain terminal 332D of the transistor 332 and the gate terminal 334G of the transistor 334. The drain terminal 334D of the transistor 334 is coupled to the drain terminal 330D of the clamp transistor 330.

Figure 4:
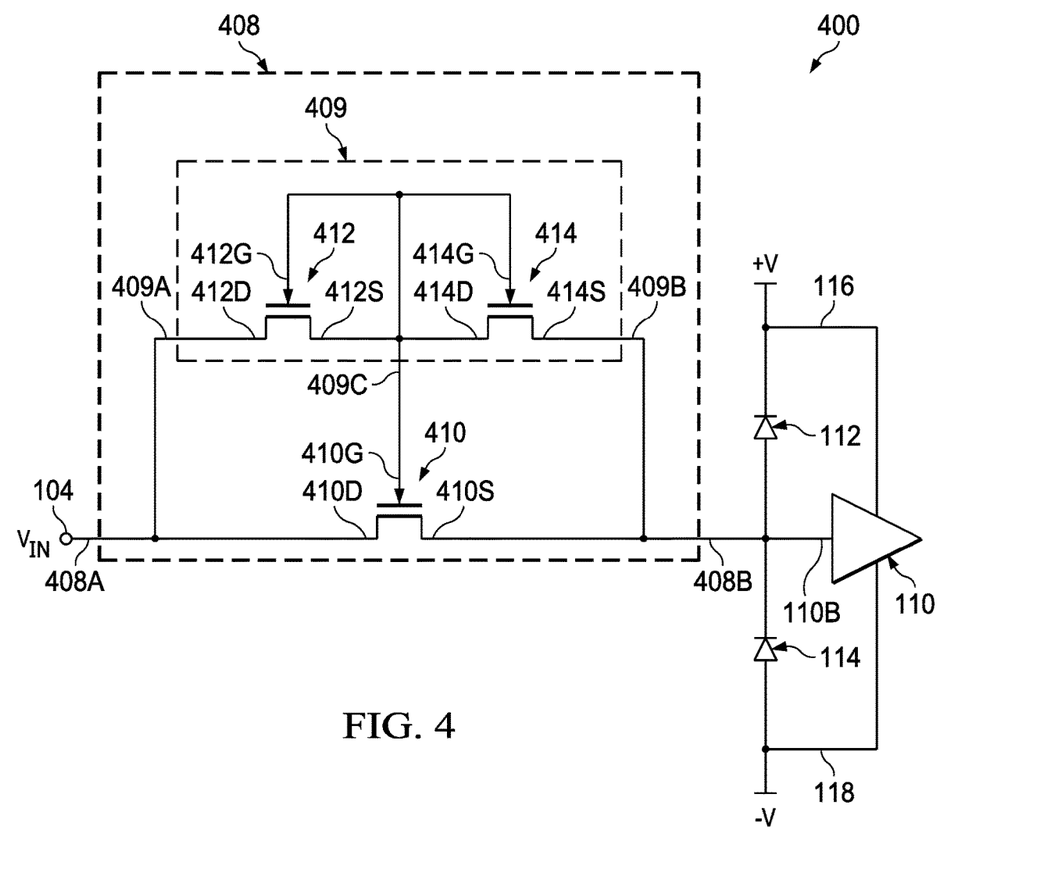

FIG. 4 shows a schematic diagram for an overvoltage protection circuit 408 in accordance with this description. The overvoltage protection circuit 408 is an implementation of the overvoltage protection circuit 106 or the overvoltage protection circuit 108. The amplifier 110, the diode 112, and the diode 114 are shown in FIG. 4 for context. The overvoltage protection circuit 408 includes an input terminal 408A, an output terminal 408B, a minimum selector circuit 409 and a clamp transistor 410. The clamp transistor 410 is an n-channel depletion mode JFET in some implementations of the 408. The resistance of the clamp transistor 410 varies based on the voltage at the input terminal 408A to control the current flow between the input terminal 408A and the output terminal 408B. The clamp transistor 410 includes a drain terminal 410D coupled to the input terminal 408A (and the input terminal 104 or the input terminal 102) and a source terminal 410S coupled to the output terminal 408B (and the input 110B or the input 110A of the amplifier 110).

The minimum selector circuit 409 is coupled to the clamp transistor 410 and controls the resistance of the clamp transistor 410 based on the voltage at the input terminal 408A. The minimum selector circuit 409 includes a terminal 409A, a terminal 409B, and a terminal 409C. The terminal 409A is coupled to the drain terminal 410D of the clamp transistor 410. The terminal 409B is coupled to the source terminal 410S of the clamp transistor 410. The terminal 409C is coupled to the gate terminal 410G of the clamp transistor 410.

The minimum selector circuit 409 includes a transistor 412 and a transistor 414. The transistor 412 and the transistor 414 are n-channel depletion mode JFETs in some implementations of the 409. The transistor 412 controls the clamp transistor 410 when the voltage at the input terminal 104 is greater than +V, and the transistor 414 controls the clamp transistor 410 when the voltage at the input terminal 104 is less than −V. The drain terminal 412D of the transistor 412 is coupled to the drain terminal 410D of the clamp transistor 410. The source terminal 412S of the transistor 412 is coupled to the gate terminal 412G of the transistor 412 and the gate terminal 410G of the clamp transistor 410. The drain terminal 414D of the transistor 414 is coupled to the source terminal 412S of the transistor 412 and the gate terminal 414G of the transistor 414. The source terminal 414S of the transistor 414 is coupled to the source terminal 410S of the clamp transistor 410.

Figure 5:
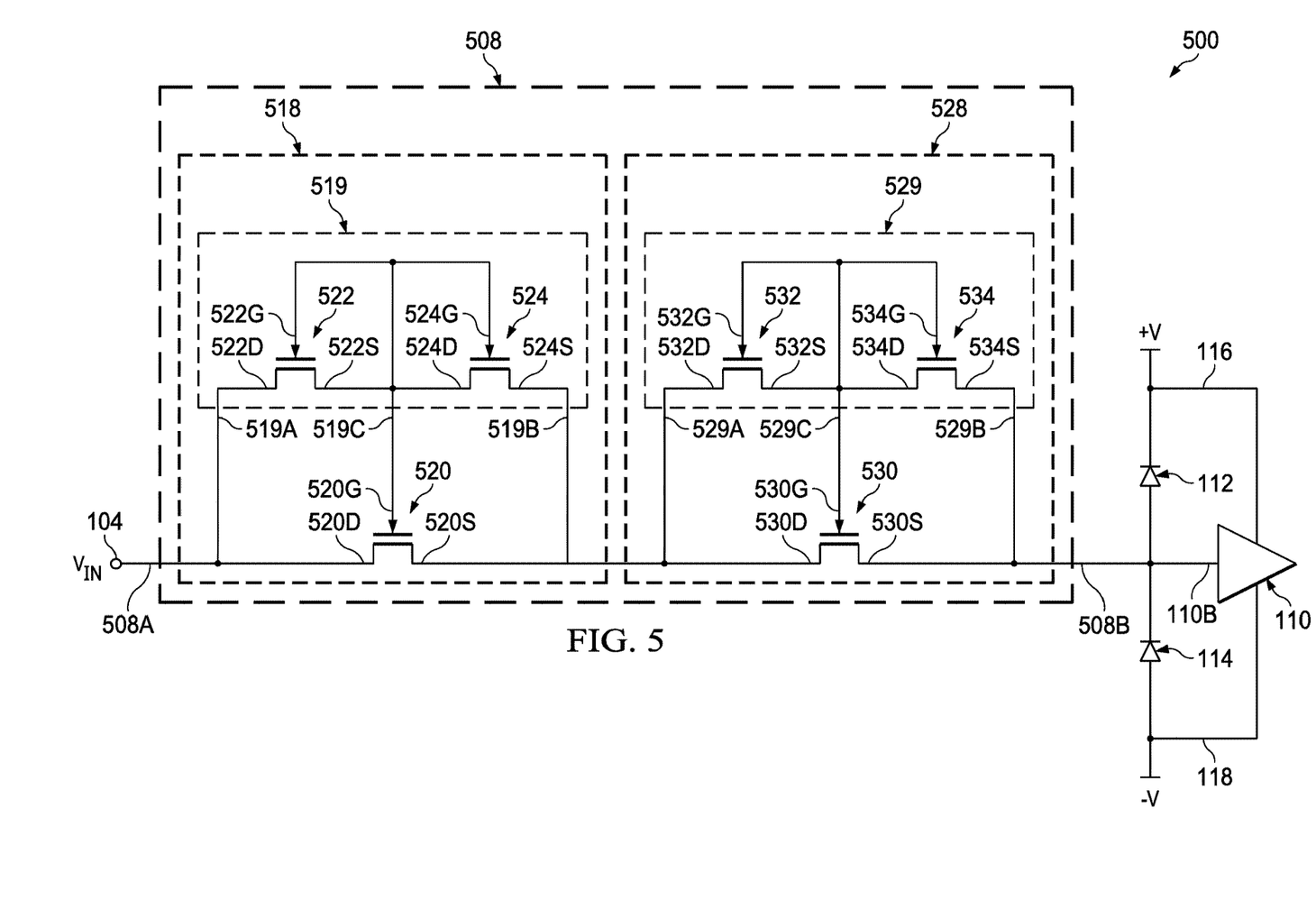

FIG. 5 shows a schematic diagram for an overvoltage protection circuit 508 in accordance with this description. The overvoltage protection circuit 508 is an implementation of the overvoltage protection circuit 106 or the overvoltage protection circuit 108. The amplifier 110, the diode 112, and the diode 114 are shown in FIG. 5 for context. The overvoltage protection circuit 308 includes an input terminal 508A, an output terminal 508B, an overvoltage protection circuit 518 and an overvoltage protection circuit 528. The overvoltage protection circuit 518 and the overvoltage protection circuit 528 are coupled in series. The overvoltage protection circuit 518 and the overvoltage protection circuit 528 are implementations of the overvoltage protection circuit 408. Some implementations of the overvoltage protection circuit 508 provide twice the overvoltage protection as provided by implementations of the overvoltage protection circuit 408, while requiring less circuit area than some series JFET-based overvoltage protection circuits. For example, an implementation of the overvoltage protection circuit 508 provides protection from overvoltage as high as 80 volts, while the overvoltage protection circuit 408 provides protection from overvoltage as high as 40 volts.

The overvoltage protection circuit 518 includes a minimum selector circuit 519 and a clamp transistor 520. The clamp transistor 520 is an n-channel depletion mode JFET in some implementations of the 508. The resistance of the clamp transistor 520 varies based on the voltage at the input terminal 508A to control the current flow between the input terminal 508A and the output terminal 508B. The clamp transistor 520 includes a drain terminal 520D coupled to the input terminal 508A and a source terminal 520S coupled to the output terminal 508B via the overvoltage protection circuit 528.

The minimum selector circuit 519 is coupled to the clamp transistor 520 and controls the resistance of the clamp transistor 520 based on the voltage at the input terminal 508A. The minimum selector circuit 519 includes a terminal 519A, a terminal 519B, and a terminal 519C. The terminal 519A is coupled to the drain terminal 520D of the clamp transistor 520. The terminal 519B is coupled to the source terminal 520S of the clamp transistor 520. The terminal 519C is coupled to the gate terminal 520G of the clamp transistor 520.

The minimum selector circuit 519 includes a transistor 522 and a transistor 524. The transistor 522 and the transistor 524 are n-channel depletion mode JFETs in some implementations of the 519. The transistor 522 controls the clamp transistor 520 when the voltage at the input terminal 104 is greater than +V, and the transistor 524 controls the clamp transistor 520 when the voltage at the input terminal 104 is less than −V. The drain terminal 522D of the transistor 522 is coupled to the drain terminal 520D of the clamp transistor 520. The source terminal 522S of the transistor 522 is coupled to the gate terminal 522G of the transistor 522 and the gate terminal 520G of the clamp transistor 520. The drain terminal 524D of the transistor 524 is coupled to the source terminal 522S of the transistor 522 and the gate terminal 524G of the transistor 524. The source terminal 524S of the transistor 524 is coupled to the source terminal 520S of the clamp transistor 520.

The overvoltage protection circuit 528 includes a minimum selector circuit 529 and a clamp transistor 530. The clamp transistor 530 is an n-channel depletion mode JFET in some implementations of the 528. The resistance of the clamp transistor 530 varies based on the voltage at the source terminal 520S of the clamp transistor 520 to control the current flow between the input terminal 508A and the output terminal 508B. The clamp transistor 530 includes a drain terminal 530D coupled to the source terminal 520S of the clamp transistor 520 and a source terminal 530S coupled to the output terminal 508B (and the input terminal 1108 of the amplifier 110).

The minimum selector circuit 529 is coupled to the clamp transistor 530 and controls the resistance of the clamp transistor 530 based on the voltage at the source terminal 520S of the clamp transistor 520. The minimum selector circuit 529 includes a terminal 529A, a terminal 529B, and a terminal 529C. The terminal 529A is coupled to the drain terminal 530D of the clamp transistor 530. The terminal 529B is coupled to the source terminal 530S of the clamp transistor 530. The terminal 529C is coupled to the gate terminal 530G of the clamp transistor 530.

The minimum selector circuit 529 includes a transistor 532 and a transistor 534. The transistor 532 and the transistor 534 are n-channel depletion mode JFETs in some implementations of the 529. The transistor 532 controls the clamp transistor 530 when the voltage at the input terminal 104 is greater than +V, and the transistor 534 controls the clamp transistor 530 when the voltage at the input terminal 104 is less than −V. The drain terminal 532D of the transistor 532 is coupled to the drain terminal 530D of the clamp transistor 530. The source terminal 532S of the transistor 532 is coupled to the gate terminal 532G of the transistor 532 and the gate terminal 530G of the clamp transistor 530. The drain terminal 534D of the transistor 534 is coupled to the source terminal 532S of the transistor 532 and the gate terminal 534G of the transistor 534. The source terminal 534S of the transistor 534 is coupled to the source terminal 530S of the clamp transistor 530.

Modifications are possible in the described embodiments, and other embodiments are possible, within the scope of the claims.

What is claimed is:

1. An amplifier circuit comprising:
   a signal input terminal;
   an amplifier; and
   an overvoltage protection circuit coupled to the signal input terminal and an input of the amplifier, and comprising:
     a first transistor comprising:
       a first terminal coupled to the signal input terminal; and
       a second terminal coupled to the input of the amplifier;
     a second transistor comprising:
       a first terminal coupled to the signal input terminal;
       a second terminal coupled to a third terminal of the first transistor; and
       a third terminal coupled to the third terminal of the first transistor;
     a third transistor comprising:
       a first terminal coupled to the third terminal of the first transistor;
       a second terminal coupled to the input of the amplifier; and
       a third terminal coupled to the third terminal of the first transistor;
   wherein the overvoltage protection circuit further comprises:
     a fourth transistor comprising:
       a first terminal coupled to the second terminal of the first transistor; and
       a second terminal coupled to the input of the amplifier;
   wherein the overvoltage protection circuit further comprises:
     a fifth transistor comprising:
       a first terminal coupled to the second terminal of the first transistor;
       a second terminal coupled to a third terminal of the fourth transistor; and
       a third terminal coupled to the third terminal of the fourth transistor.

2. An amplifier circuit comprising:
   a signal input terminal;
   an amplifier; and
   an overvoltage protection circuit coupled to the signal input terminal and an input of the amplifier, and comprising:
     a first transistor comprising:
       a first terminal coupled to the signal input terminal; and
       a second terminal coupled to the input of the amplifier;
     a second transistor comprising:
       a first terminal coupled to the signal input terminal;
       a second terminal coupled to a third terminal of the first transistor; and
       a third terminal coupled to the third terminal of the first transistor;
     a third transistor comprising:
       a first terminal coupled to the third terminal of the first transistor;
       a second terminal coupled to the input of the amplifier; and
       a third terminal coupled to the third terminal of the first transistor;
   wherein the overvoltage protection circuit further comprises:
     a fourth transistor comprising:
       a first terminal coupled to the second terminal of the first transistor; and
       a second terminal coupled to the input of the amplifier;
   wherein the overvoltage protection circuit further comprises:
     a fifth transistor comprising:
       a first terminal coupled to a third terminal of the fourth transistor;
       a second terminal coupled to the input of the amplifier; and
       a third terminal coupled to the third terminal of the fourth transistor.

3. An amplifier circuit comprising:
   a signal input terminal;
   an amplifier; and
   an overvoltage protection circuit coupled to the signal input terminal and an input of the amplifier, and comprising:
     a first transistor comprising:
       a first terminal coupled to the signal input terminal; and
       a second terminal coupled to the input of the amplifier;
     a second transistor comprising:
       a first terminal coupled to the signal input terminal;
       a second terminal coupled to a third terminal of the first transistor; and
       a third terminal coupled to the third terminal of the first transistor;

a third transistor comprising:
  a first terminal coupled to the third terminal of the first transistor;
  a second terminal coupled to the input of the amplifier; and
  a third terminal coupled to the third terminal of the first transistor;
wherein:
the signal input terminal is a first signal input terminal;
the amplifier circuit comprises a second signal input terminal;
the input is a first input;
the amplifier comprises a second input;
the overvoltage protection circuit is a first overvoltage protection circuit; and
the amplifier circuit comprises a second overvoltage protection circuit coupled to the second signal input terminal and the second input, and comprising:
  a fourth transistor comprising:
    a first terminal coupled to the second signal input terminal; and
    a second terminal coupled to the second input of the amplifier;
  a fifth transistor comprising:
    a first terminal coupled to the second signal input terminal;
    a second terminal coupled to a third terminal of the fourth transistor; and
    a third terminal coupled to the third terminal of the fourth transistor;
  a sixth transistor comprising:
    a first terminal coupled to the third terminal of the fourth transistor;
    a second terminal coupled to the second input of the amplifier; and
    a third terminal coupled to the third terminal of the fourth transistor.

4. The amplifier circuit of claim 3, wherein the second overvoltage protection circuit further comprises:
  a seventh transistor comprising:
    a first terminal coupled to the second terminal of the fourth transistor; and
    a second terminal coupled to the second input of the amplifier;
  an eighth transistor comprising:
    a first terminal coupled to the second terminal of the fourth transistor;
    a second terminal coupled to a third terminal of the seventh transistor; and
    a third terminal coupled to the third terminal of the seventh transistor; and
  a ninth transistor comprising:
    a first terminal coupled to a third terminal of the seventh transistor;
    a second terminal coupled to the second input of the amplifier; and
    a third terminal coupled to the third terminal of the seventh transistor.

5. An overvoltage protection circuit, comprising:
an input terminal;
an output terminal;
a first transistor comprising:
  a first terminal coupled to the input terminal; and
  a second terminal coupled to the output terminal;
a second transistor comprising:
  a first terminal coupled to the input terminal;
  a second terminal coupled to a third terminal of the first transistor; and
  a third terminal coupled to the third terminal of the first transistor;
a third transistor comprising:
  a first terminal coupled to the third terminal of the first transistor;
  a second terminal coupled to the output terminal;
  a third terminal coupled to the third terminal of the first transistor;
a fourth transistor comprising:
  a first terminal coupled to the second terminal of the first transistor; and
  a second terminal coupled to the output terminal; and
a fifth transistor comprising:
  a first terminal coupled to the second terminal of the first transistor;
  a second terminal coupled to a third terminal of the fourth transistor; and
  a third terminal coupled to the third terminal of the fourth transistor.

6. An overvoltage protection circuit, comprising:
an input terminal;
an output terminal;
a first transistor comprising:
  a first terminal coupled to the input terminal; and
  a second terminal coupled to the output terminal;
a second transistor comprising:
  a first terminal coupled to the input terminal;
  a second terminal coupled to a third terminal of the first transistor; and
  a third terminal coupled to the third terminal of the first transistor;
a third transistor comprising:
  a first terminal coupled to the third terminal of the first transistor;
  a second terminal coupled to the output terminal;
  a third terminal coupled to the third terminal of the first transistor;
a fourth transistor comprising:
  a first terminal coupled to the second terminal of the first transistor; and
  a second terminal coupled to the output terminal; and
a fifth transistor comprising:
  a first terminal coupled to a third terminal of the fourth transistor;
  a second terminal coupled to the output terminal; and
  a third terminal coupled to the third terminal of the fourth transistor.

7. An overvoltage protection circuit, comprising:
an input terminal;
an output terminal;
a clamp transistor configured to control current flow between the input terminal and the output terminal, and comprising:
  a first terminal coupled to the input terminal; and
  a second terminal coupled to the output terminal;
a selector circuit configured to control a resistance of the clamp transistor based on a voltage at the input terminal, and comprising:
  a first terminal coupled to the first terminal of the clamp transistor;
  a second terminal coupled to the second terminal of the clamp transistor; and a third terminal coupled to a third terminal of the clamp transistor;

wherein:
the selector circuit is a first selector circuit; and
the overvoltage protection circuit comprises:
a second selector circuit comprising:
a first transistor comprising:
a first terminal coupled to a third terminal of the second clamp transistor;
a second terminal coupled to the third terminal of the second clamp transistor; and
a third terminal coupled to the second terminal of the second clamp transistor.

8. The overvoltage protection circuit of claim 7, wherein the second selector circuit comprises:
a second transistor comprising:
a first terminal coupled to the first terminal of the second clamp transistor;
a second terminal coupled to the third terminal of the second clamp transistor; and
a third terminal coupled to the third terminal of the second clamp transistor.

9. The overvoltage protection circuit of claim 8, wherein the second clamp transistor, the first transistor of the second selector circuit, and the second transistor of the second selector circuit are junction field effect transistors.

* * * * *